United States Patent
Peng et al.

(10) Patent No.: US 9,972,746 B2
(45) Date of Patent: May 15, 2018

(54) SUBSTRATE WITH LITHIUM IMIDE LAYER, LED WITH LITHIUM IMIDE LAYER AND MANUFACTURING METHOD THEREOF

(71) Applicant: OPTO TECH CORPORATION, Hsinchu (TW)

(72) Inventors: Lung-Han Peng, Taipei (TW); Jiun-Yun Li, Taipei (TW); Jun-Wei Peng, New Taipei (TW); Po-Yuan Chiu, Taoyuan (TW)

(73) Assignee: OPTO TECH CORPORATION, Hsinchu (TW)

( * ) Notice: Subject to any disclaimer, the term of this patent is extended or adjusted under 35 U.S.C. 154(b) by 0 days. days.

(21) Appl. No.: 15/422,658

(22) Filed: Feb. 2, 2017

(65) Prior Publication Data
US 2018/0062024 A1   Mar. 1, 2018

(30) Foreign Application Priority Data
Aug. 30, 2016  (TW) .............................. 105127877 A

(51) Int. Cl.
*H01L 33/00* (2010.01)
*H01L 33/32* (2010.01)
*H01L 33/36* (2010.01)

(52) U.S. Cl.
CPC ........ *H01L 33/007* (2013.01); *H01L 33/0079* (2013.01); *H01L 33/32* (2013.01); *H01L 33/36* (2013.01); *H01L 2933/0016* (2013.01)

(58) Field of Classification Search
CPC ... H01L 33/007; H01L 33/0079; H01L 33/32; H01L 33/36; H01L 2933/0016

USPC ..... 257/78, 99, 183, 680, E27.006, E33.005, 257/E33.023, E33.067, E33.068; 438/31, 438/46, 47, 478, 689
See application file for complete search history.

(56) References Cited

U.S. PATENT DOCUMENTS

| | | | | |
|---|---|---|---|---|
| 2004/0192040 A1* | 9/2004 | Peng | ...................... | C30B 33/00 438/689 |
| 2005/0035364 A1* | 2/2005 | Sano | ...................... | B82Y 20/00 257/99 |
| 2011/0044364 A1* | 2/2011 | Farrell | ................... | B82Y 20/00 372/45.01 |
| 2013/0214640 A1* | 8/2013 | Yamazaki | ........... | H01L 41/0475 310/313 B |
| 2016/0138182 A1* | 5/2016 | Kuech | .................... | C30B 1/023 428/698 |
| 2016/0190387 A1* | 6/2016 | Sun | ................... | H01L 21/02458 438/47 |

OTHER PUBLICATIONS

M Ishida, M Kuroda, T Ueda and T Tanaka, "Nonpolar AlGaN/GaN HFETs with a normally off operation", Jan. 19, 2012, Semiconductor Science and Technology, 2012 IOP Publishing Ltd, UK an the USA.

(Continued)

*Primary Examiner* — Dao H Nguyen
(74) *Attorney, Agent, or Firm* — WPAT, PC

(57) ABSTRACT

A substrate with a lithium imide layer, a LED with a lithium imide layer and a manufacturing method of the LED are provided. The substrate includes a lithium niobate layer and a lithium imide layer. The lithium imide layer is formed on a surface of the lithium niobate layer.

5 Claims, 3 Drawing Sheets

(56) References Cited

OTHER PUBLICATIONS

J Wu, R Palai, W M Jadwisienczak and M S Shur, "Bandgap engineering in MBE grown Al1-xGaxN epitaxial columnar nanostructures", Dec. 12, 2011, Journal of Physics D: Applied Physics, 2012 IOP Publishing Ltd, UK an the USA.

Young Huang, Andrew Melton, Balakrishnam Jampana, Muhammad Jamil, Jae-Hyun Ryou, Russell D. Dupuis, and Ian T. Ferguson, "Growth and characterization of InxGa1-xN alloys by metalorganic chemical vapor deposition for solar cell applications", Feb. 23, 2012, vol. 2, 2012, Journal of Photonics for Energy, USA.

\* cited by examiner

SUBSTRATE WITH LITHIUM IMIDE LAYER, LED WITH LITHIUM IMIDE LAYER AND MANUFACTURING METHOD THEREOF

This application claims the benefit of Taiwan Patent Application No. 105127877, filed Aug. 30, 2016, the subject matter of which is incorporated herein by reference.

FIELD OF THE INVENTION

The present invention relates to a semiconductor substrate, a LED and a manufacturing method thereof, and more particularly to a substrate with a lithium imide layer, a LED with a lithium imide layer and a manufacturing method thereof.

BACKGROUND OF THE INVENTION

Generally, a gallium nitride light emitting diode (GaN LED) is grown on a C-plane of a sapphire substrate. However, the lattice constant and the thermal expansion coefficient of the sapphire substrate are obviously distinguished from those of gallium nitride. Consequently, a strain between the gallium nitride epitaxy layer and the sapphire substrate is usually generated.

Moreover, because of the electric insulation property and the thermal insulation property of the sapphire substrate, the efficiency, life and brightness of the GaN LED are adversely affected. Consequently, the technology of growing GaN on sapphire is not satisfied.

Recently, researchers make efforts in the technology of growing gallium nitride on the gallium nitride substrate (i.e., GaN on GaN). Due to the lattice matching effect, it is presumed that the epitaxy layer grown on the GaN substrate has enhanced efficiency for the light emitting diode or the laser diode. However, it is difficult to fabricate the gallium nitride substrate, and the fabricating cost of the gallium nitride substrate is very high. In other words, mass production of the gallium nitride substrate is not feasible so far.

In addition to the sapphire substrate and the gallium nitride substrate, other technologies are researched. For example, the technology of growing gallium nitride on the silicon substrate (GaN on Si) and the technology of growing gallium nitride on the silicon carbide substrate (GaN on SiC) are related technologies.

SUMMARY OF THE INVENTION

The present invention provides a substrate with a lithium imide layer, a LED with a lithium imide layer and a manufacturing method thereof. Due to the lattice match between the lithium imide layer and the gallium nitride (GaN), aluminum gallium nitride (AlGaN) or aluminum nitride (AlN), a metal nitride layer is suitably grown on the lithium imide layer.

An embodiment of the present invention provides a substrate. The substrate includes a lithium niobate layer and a lithium imide layer. The lithium imide layer is formed on a surface of the lithium niobate layer.

Another embodiment of the present invention provides a manufacturing method of a light emitting diode. Firstly, a lithium niobate layer is provided. Then, a chemical reaction is carried out to form a lithium imide layer on a surface of the lithium niobate layer. Then, a stack structure of plural metal nitride layers is formed on a first surface of the lithium imide layer. Then, a lift-off process is performed to separate the lithium niobate layer from the lithium imide layer, so that a second surface of the lithium imide layer is exposed. Then, a metal layer is formed on a second surface of the lithium imide layer. Afterwards, an electrode is formed on the stack structure of the plural metal nitride layers.

A further embodiment of the present invention provides a light emitting diode. The light emitting diode includes a lithium imide layer, a stack structure of plural metal nitride layers, a metal layer and an electrode. The stack structure of plural metal nitride layers is formed on a first surface of the lithium imide layer. The metal layer is formed on a second surface of the lithium imide layer. The electrode is formed on the stack structure of the plural metal nitride layers.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a substrate with a lithium imide ($Li_2NH$) layer. After a lithium niobate ($LiNbO_3$) layer is subjected to a chemical reaction, the lithium imide layer is formed on a surface of the lithium niobate layer. Consequently, the substrate with the lithium imide layer is produced. The lattice constant of the lithium imide layer is close to the lattice constant of the nitrides of the elements of Group III-V. Consequently, the nitrides of the elements of Group III-V are suitably grown on the lithium imide layer. Consequently, the light emitting diode (LED) with the lithium imide layer is produced.

Figure 1:
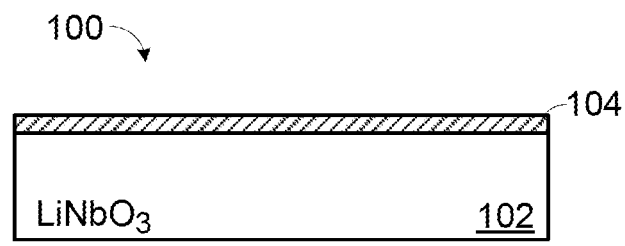
FIG. 1 is a substrate with a lithium imide layer according to an embodiment of the present invention.

FIG. 1 is a substrate with a lithium imide layer according to an embodiment of the present invention. As shown in FIG. 1, the substrate 100 comprises a lithium niobate layer 102 and a lithium imide layer 104. The lithium imide layer 104 is formed on a surface of the lithium niobate layer 102.

Figure 2:
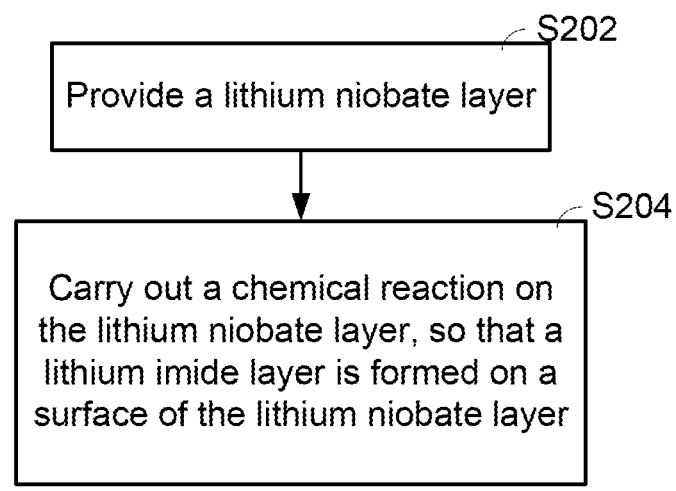
FIG. 2 is a flowchart illustrating a manufacturing method of a substrate with a lithium imide layer according to a first embodiment of the present invention.

FIG. 2 is a flowchart illustrating a manufacturing method of a substrate with a lithium imide layer according to a first embodiment of the present invention. Firstly, a lithium niobate layer is provided (Step S202). Then, a chemical reaction is carried out on the lithium niobate layer, and thus a lithium imide layer is formed on a surface of the lithium niobate layer (Step S204). For example, the chemical reaction is an ammoniation reaction.

In an embodiment, after the lithium niobate layer 102 is treated with ammonia gas ($NH_3$) at a flow rate of 40 sscm at 700° C. for 1 hour, the lithium imide layer 104 with a thickness of about 1.64 μm is formed on the surface of the lithium imide layer 104. Consequently, the substrate 100 with the lithium imide layer 104 is produced.

Figure 3A:
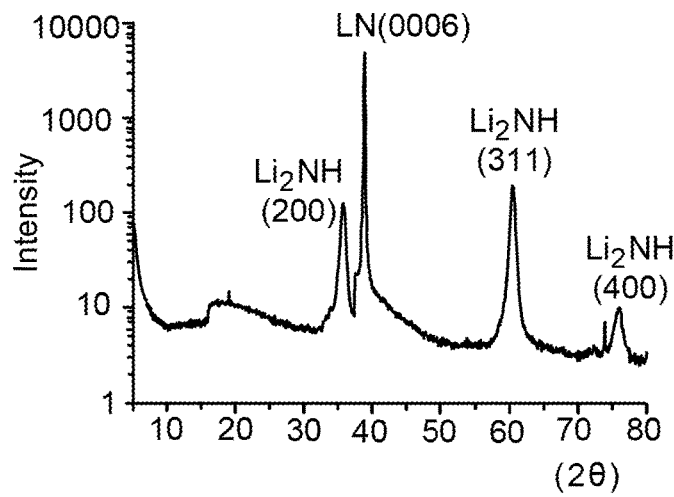
FIG. 3A schematically illustrates the X-ray diffraction pattern of the substrate with the lithium imide layer according to an embodiment of the present invention.
Figure 3B:
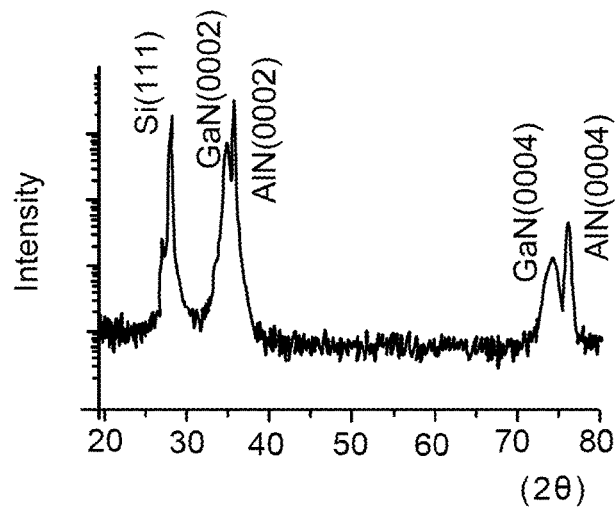
FIG. 3B schematically illustrates the X-ray diffraction pattern of a silicon substrate with an aluminum gallium nitride layer ($Al_{(1-x)}Ga_xN$)
Figure 3C:
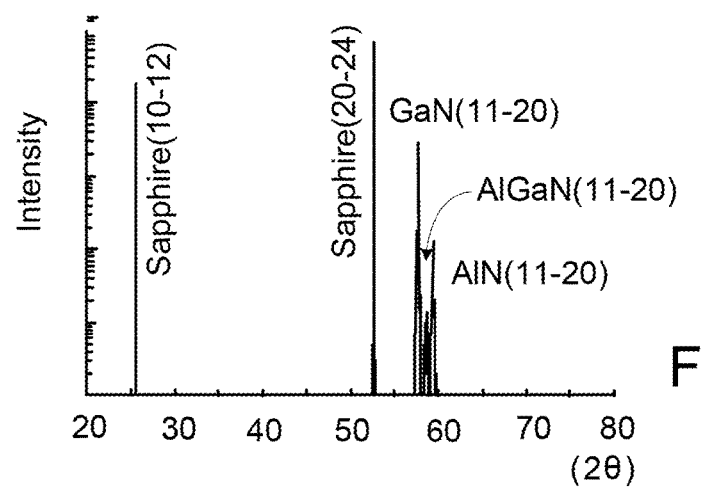
FIG. 3C schematically illustrates the X-ray diffraction pattern of a sapphire substrate with a gallium nitride (GaN) layer, an aluminum gallium nitride (AlGaN) layer and an aluminum nitride (AlN) layer.

FIG. 3A schematically illustrates the X-ray diffraction pattern of the substrate with the lithium imide layer according to an embodiment of the present invention. FIG. 3B schematically illustrates the X-ray diffraction pattern of a silicon substrate with an aluminum gallium nitride layer $Al_{(1-x)}Ga_xN$. FIG. 3C schematically illustrates the X-ray diffraction pattern of a sapphire substrate with a gallium nitride (GaN) layer, an aluminum gallium nitride (AlGaN) layer and an aluminum nitride (AlN) layer.

As shown in FIGS. 3A and 3B, the 2-theta angle (2θ) of the lithium imide layer on the (200) plane is about 35.6°, the 2-theta angle (2θ) of the aluminum nitride (AlN) layer on the (0002) plane is about 36°, and the 2-theta angle (2θ) of the gallium nitride (GaN) layer on the (0002) is about 34.5°. In other words, the lattice of the lithium imide layer on the (200) plane matches the lattice of the aluminum nitride (AlN) layer on the (0002) plane or the lattice of the gallium nitride (GaN) layer on the (0002).

Similarly, the lattice of the lithium imide layer on the (400) plane matches the lattice of the aluminum nitride (AlN) layer on the (0004) plane or the lattice of the gallium nitride (GaN) layer on the (0004).

As shown in FIGS. 3A and 3C, the 2-theta angle (2θ) of the lithium imide layer on the (311) plane is about 60.42°, and the 2-theta angle (2θ) of the aluminum nitride (AlN) layer on the (11-20) plane is about 60.5°. In other words, the lattice of the lithium imide layer on the (311) plane matches the lattice of the aluminum nitride (AlN) layer on the (11-20) plane.

Since the lattice of the lithium imide layer matches the lattice of the aluminum nitride (AlN) layer or the lattice of the gallium nitride (GaN) layer, a light emitting diode can be produced by forming metal nitride layers on the lithium imide layer.

Figure 4A:
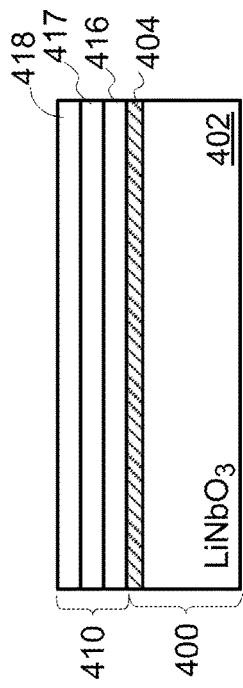
FIGS. 4A, 4B and 4C are schematic cross-sectional views illustrating a process of manufacturing a LED with a lithium imide layer according to an embodiment of the present invention.
Figure 4B:
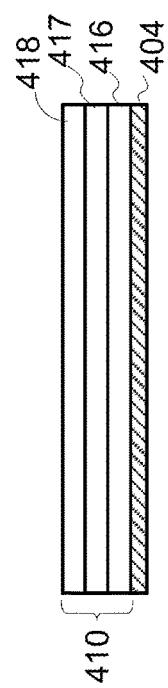
Figure 4C:
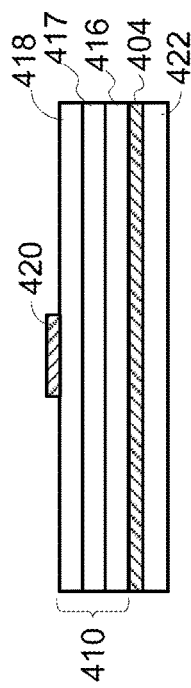

FIGS. 4A, 4B and 4C are schematic cross-sectional views illustrating a process of manufacturing a LED with a lithium imide layer according to an embodiment of the present invention.

Firstly, a substrate 400 with a lithium niobate layer 402 and a lithium imide layer 404 is provided. Then, a stack structure 410 of plural metal nitride layers are formed on the lithium imide layer 404. In an embodiment, the plural metal nitride layers comprise a P-type metal nitride layer 416, a metal nitride active layer 417 and an N-type metal nitride layer 418. For example, the P-type metal nitride layer 416 is a P-type aluminum nitride (AlN) layer, a P-type aluminum gallium nitride (AlGaN) layer or a P-type gallium nitride (GaN) layer. The metal nitride active layer 417 is an aluminum nitride (AlN) active layer, an aluminum gallium nitride (AlGaN) active layer or a gallium nitride (GaN) active layer. The N-type metal nitride layer 418 is an N-type aluminum nitride (AlN) layer, an N-type aluminum gallium nitride (AlGaN) layer or an N-type gallium nitride (GaN) layer. In some embodiments, the stack structure 410 comprises more than three metal nitride layers.

Then, as shown in FIG. 4B, a lift-off process is performed to separate the lithium niobate layer 402 from the lithium imide layer 404. After the lift-off process is completed, the plural meal nitride layers are stacked on a first surface of the lithium imide layer 404. Since the lithium niobate layer 402 is detached from the lithium imide layer 404, a second surface of the lithium imide layer 404 is exposed. The lift-off process is a laser lift-off process or any other appropriate lift-off process.

Then, as shown in FIG. 4C, a bonding process is performed. By the bonding process, a metal layer 422 is attached on the second surface of the lithium imide layer 404. The metal layer 422 is used as a reflective layer of the LED or an electrode of the LED. Afterwards, another electrode 420 is formed on the stack structure 410 of plural metal nitride layers. Consequently, the LED with the lithium imide layer is manufactured.

Figure 5:
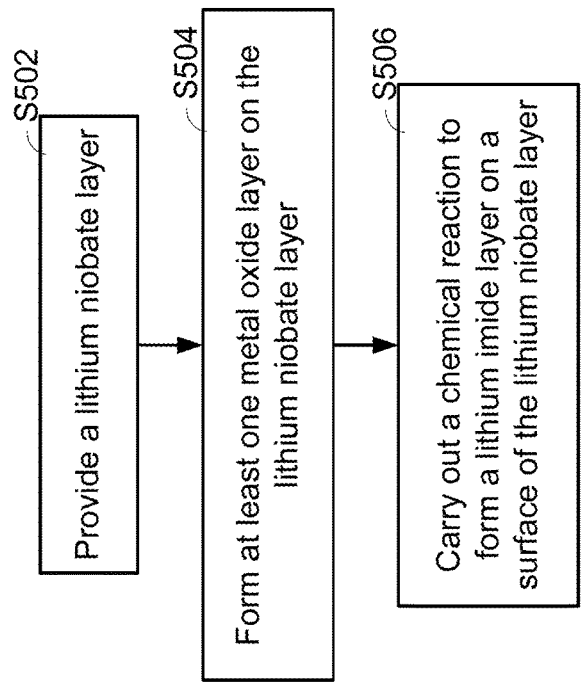
FIG. 5 is a flowchart illustrating a manufacturing method of a substrate with a lithium imide layer according to a second embodiment of the present invention.

FIG. 5 is a flowchart illustrating a manufacturing method of a substrate with a lithium imide layer according to a second embodiment of the present invention. Firstly, a lithium niobate layer is provided (Step S402). Then, at least one metal oxide layer is formed on the lithium niobate layer (Step S404). Then, a chemical reaction is carried out to form a lithium imide layer on a surface of the lithium niobate layer (Step S406).

In the step S404, the at least one metal oxide layer is formed on the lithium niobate layer by an atomic layer deposition process. For example, the metal oxide layer is a hafnium oxide (HfO) layer or a zinc oxide (ZnO) layer. Alternatively, the at least one metal oxide layer is a stack structure of plural metal oxide layers, e.g., a three-layered stack structure of a hafnium oxide (HfO) layer, a zinc oxide (ZnO) layer and another hafnium oxide (HfO) layer. In the step S406, the chemical reaction is an ammoniation reaction.

The deposition of the metal oxide layer can accelerate the formation of the lithium imide layer. After a stack structure with a hafnium oxide (HfO) layer, a zinc oxide (ZnO) layer and another hafnium oxide (HfO) layer is deposited on the lithium niobate layer, the lithium niobate layer is treated with ammonia gas ($NH_3$) at a flow rate of 40 sscm at 700° C. for 1 hour. Then, a lithium imide layer with a thickness of about 2.532 μm is formed on the surface of the lithium imide layer. Consequently, the substrate with the lithium imide layer is produced.

From the above descriptions, the present invention provides a substrate with a lithium imide layer and a manufacturing method of the substrate. After a lithium niobate layer is subjected to a chemical reaction, the lithium imide layer is formed on a surface of the lithium niobate layer. Consequently, the substrate with the lithium imide layer is produced. The lattice constant of the lithium imide layer is close to the lattice constant of the nitrides of the elements of Group III-V. Consequently, the nitrides of the elements of Group III-V are suitably grown on the lithium imide layer. Consequently, the light emitting diode (LED) with the lithium imide layer is produced.

During the ammoniation reaction of the lithium niobate layer, dehydrogenation of the nitrogen-hydrogen bond leads to the increase of positively charged holes. Consequently, the lithium imide layer is a P-type layer. That is, the substrate with the lithium imide layer is a P-type substrate.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A substrate, comprising:
   a lithium niobate layer; and
   a lithium imide layer formed on a surface of the lithium niobate layer.

2. The substrate as claimed in claim 1, wherein after the lithium niobate layer is subjected to an ammoniation reaction, the lithium imide layer is formed on the surface of the lithium niobate layer.

3. The substrate as claimed in claim 1, wherein the substrate further comprises at least one metal oxide layer, and the at least one metal oxide layer is formed on the lithium niobate layer, wherein after the lithium niobate layer and the at least one metal oxide layer are subjected to an ammoniation reaction, the lithium imide layer is formed on the surface of the lithium niobate layer.

4. The substrate as claimed in claim 3, wherein the metal oxide layer is a hafnium oxide layer or a zinc oxide layer.

5. The substrate as claimed in claim 1, wherein the lithium imide layer is a P-type layer.

* * * * *